(12) United States Patent
Lee et al.

(10) Patent No.: US 7,008,813 B1
(45) Date of Patent: Mar. 7, 2006

(54) EPITAXIAL GROWTH OF GERMANIUM PHOTODETECTOR FOR CMOS IMAGERS

(75) Inventors: Jong-Jan Lee, Camas, WA (US); Jer-Shen Maa, Vancouver, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/069,424

(22) Filed: Feb. 28, 2005

(51) Int. Cl.
*H01L 21/00* (2006.01)

(52) U.S. Cl. .............................. 438/56; 438/58; 438/89; 148/DIG. 101

(58) Field of Classification Search ................... 438/57, 438/89; 148/DIG. 101
See application file for complete search history.

(56) References Cited

U.S. PATENT DOCUMENTS 6,204,139 B1    3/2001  Liu et al.
6,635,110 B1 *  10/2003 Luan et al. .................... 117/4
6,838,743 B1 *  1/2005  Yamada et al. ............. 257/461
2005/0205954 A1 * 9/2005  King et al. .................. 257/431

OTHER PUBLICATIONS

Liu et al., *Electric-pulse-induced reversible resistance change effect in magnetoresistive films*, Applied Physics Letters, vol. 76, No. 19; May 8, 2000, pp 2749-2751.

* cited by examiner

*Primary Examiner*—Trung Dang
(74) *Attorney, Agent, or Firm*—David C. Ripma

(57) ABSTRACT

A method of fabricating a germanium photodetector includes preparing a silicon wafer as a silicon substrate; depositing a layer of silicon nitride on the silicon substrate; patterning and etching the silicon nitride layer; depositing a first germanium layer on the silicon nitride layer; patterning and etching the germanium layer wherein a portion of the germanium layer is in direct physical contact with the silicon substrate; depositing a layer of silicon oxide on the germanium layer wherein the germanium layer is encapsulated by the silicon oxide layer; annealing the structure at a temperature wherein the germanium melts and the other layers remain solid; growing a second, single-crystal layer of germanium on the structure by liquid phase epitaxy; selectively removing the silicon oxide layer; and completing the germanium photodetector.

20 Claims, 4 Drawing Sheets

EPITAXIAL GROWTH OF GERMANIUM PHOTODETECTOR FOR CMOS IMAGERS

FIELD OF THE INVENTION

This invention relates to photodetector and specifically to fabrication of a germanium type Photodetector wherein the germanium is formed on a silicon substrate, having CMOS components formed thereon, by a liquid phase epitaxy (LPE) process.

BACKGROUND OF THE INVENTION

In a related application, Fabrication of Thin Film Germanium Infrared Sensor by Bonding to Silicon Wafer, Ser. No. 10/993,533, filed Nov. 19, 2004, and Germanium Infrared Sensor for CMOS Imagers. Ser. No. 11/069,422, filed Feb. 28, 2005, we disclosed how a germanium IR detector may be formed on a silicon CMOS circuit by a bonding process, in which either a germanium donor wafer or a germanium epi wafer was used. Because the size of commercially available germanium wafers are smaller than that of silicon wafers, the foregoing processes cannot take advantage of larger size silicon wafers. Additionally, consistently good quality germanium-epi film on silicon wafer are difficult to fabricate. Further, germanium film transfer is a complex process.

Liu et al. reported a liquid-phase epitaxy technique to fabricate germanium on insulator, Liu et al., *High-quality single-crystal Ge on insulator by liquid-phase epitaxy on Si substrates*, Appl Phys Lett, 2004, 84, 2563. This technique requires careful temperature control in order to initiate the recrystallization at the predetermined seeding region.

SUMMARY OF THE INVENTION

A method of fabricating a germanium photodetector includes preparing a silicon wafer as a silicon substrate, including fabricating a CMOS device on the silicon substrate; depositing a layer of silicon nitride on the silicon substrate; patterning and etching the silicon nitride layer; depositing a first germanium layer on the silicon nitride layer; patterning and etching the germanium layer wherein a portion of the germanium layer is in direct physical contact with the silicon substrate; depositing a layer of silicon oxide on the germanium layer wherein the germanium layer is encapsulated by the silicon oxide layer; annealing the structure at a temperature wherein the germanium melts and the other layers remain solid; cooling the structure in ambient conditions; growing a second, single-crystal layer of germanium on the structure by liquid phase epitaxy; selectively removing the silicon oxide layer; implanting and activating ions to form N+ and P+ regions; and completing the germanium photodetector.

It is an object of the invention to provide a method of fabricating a germanium based photodetector using an epitaxial process to grow a germanium layer.

Another object of the invention is to provide a technique for growing a single- crystal germanium layer and to fabricate a germanium photodetector on a silicon wafer having a silicon CMOS fabricated thereon.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention provides a process for growing a good quality germanium epitaxial layer on a silicon wafer having silicon CMOS circuitry located thereon using a liquid phase epitaxy (LPE) process. The method of the invention does not require a germanium film transfer process. This invention focuses on the germanium epitaxial film growth for germanium photodetector application with the CMOS circuitry built in a silicon substrate. The silicon CMOS circuitry may be fabricated before, during or after fabrication of a germanium photodetector, therefore, the CMOS circuitry process steps are omitted from this disclosure, but are considered to be well known to those of ordinary skill in the art. A germanium photodetector constructed according to the method of the invention is capable of detecting light having a wavelength of between about 0.4 $\mu$m to 2 $\mu$m.

Figure 1:
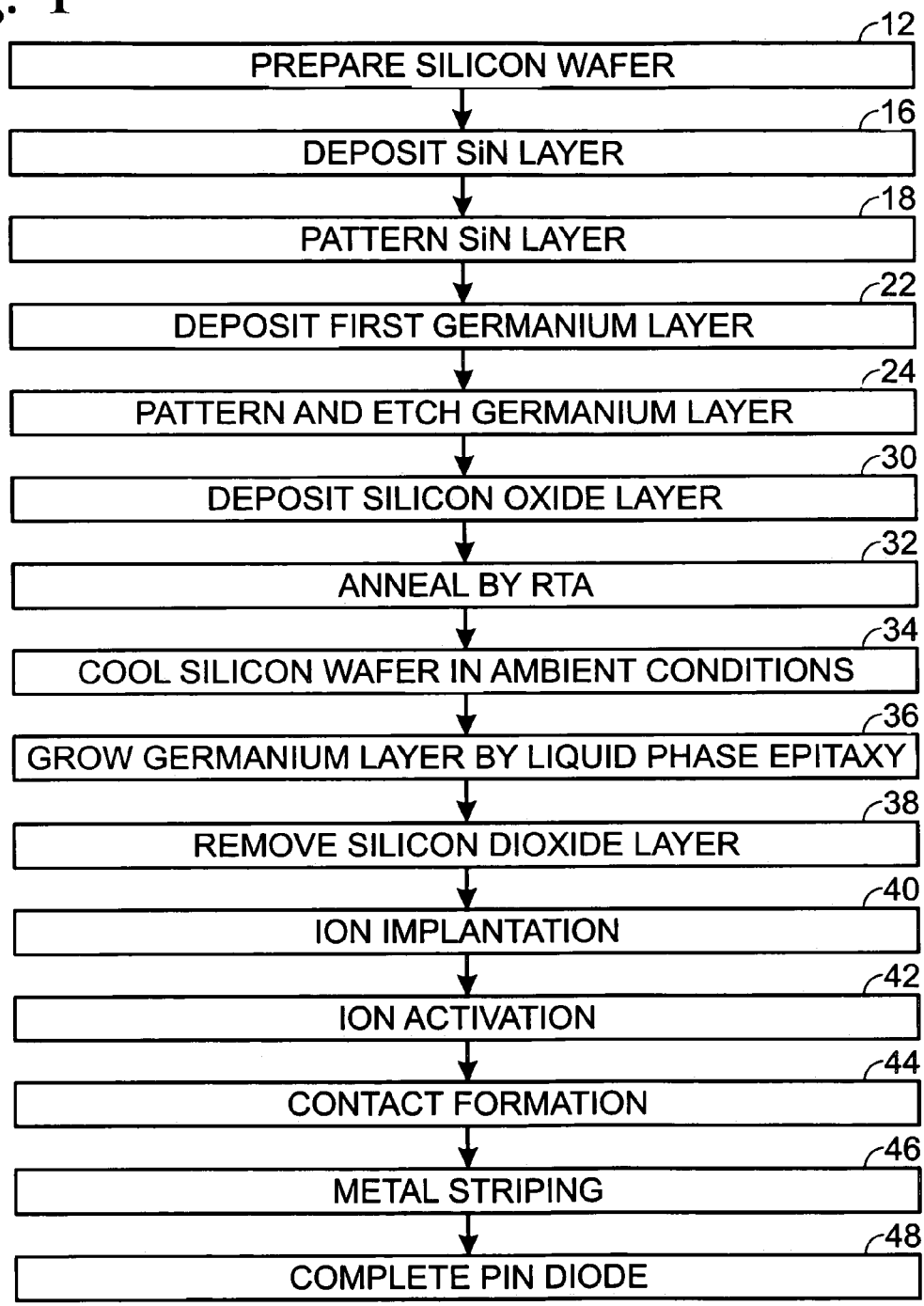
FIG. 1 is a block diagram of the method of the invention.
Figure 2:
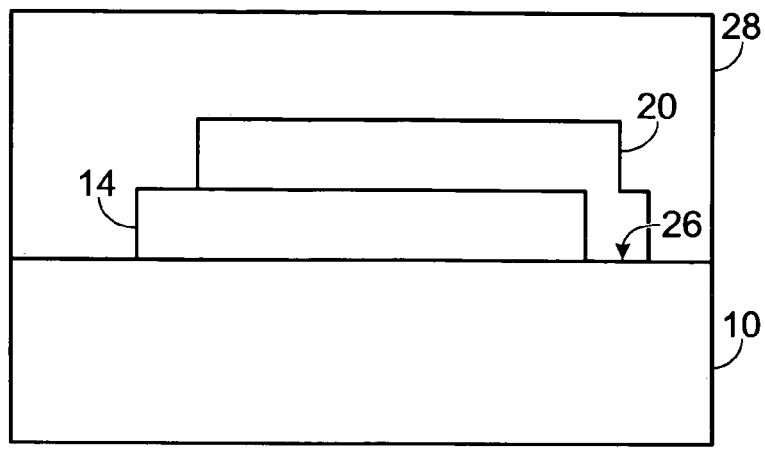
FIG. 2 is a cross-section of a germanium LPE process.

Referring to FIG. 1, the method of the invention is depicted. Referring to FIGS. 1 and 2, a silicon wafer 10 is prepared 12, which, as previously described, may include fabrication of CMOS circuitry thereon. A layer of silicon nitride 14, which serves as an insulator layer, is deposited 16 on silicon wafer 10, and then patterned and etched 18. Silicon nitride layer 14 has a thickness of between about 10 nm to 500 nm, and it may be replaced by other insulator material. A first layer of germanium 20 is then deposited 22 non-selectively on silicon nitride layer 14 and on silicon substrate 10 where silicon nitride layer 14 has been removed, to a thickness of between about 20 nm to 1000 nm. The germanium deposition method may be any of chemical vapor deposition (CVD), physical vapor deposition (PVD), molecule beam epitaxy (MBE), or any other suitable thin film deposition method. Germanium layer 20 is patterned and etched 24 into desired features, which features must include a small area having a portion of germanium layer 26 directly on top of silicon substrate 10, in direct physical contact therewith, as shown at 26 in FIG. 2, which area works as a seed window for the subsequent germanium epitaxial process.

A silicon oxide dielectric layer 28, having a thickness of between about 20 nm to 1000 nm, is deposited 30 to encapsulate the germanium film and is conformal therewith. Rapid thermal annealing (RTA) 32 is used to heat the wafer and melt the germanium film. The melting temperature for crystalline germanium is 938° C., so the RTA temperature is maintained between about 920° C. to 1000° C., for a duration of between about zero seconds to ten minutes. As used herein, a "zero time" RTA means that the temperature is rapidly ramped up to the target temperature and immediately dropped to ambient temperature. During this anneal, the germanium film is melted, while SiN layer 14 and SiO$_2$ layer 28 act as solid containers for the liquid germanium, thereby keeping the germanium liquid from flowing randomly. Silicon substrate 10, SiO₂ layer 28 and SiN layer 14 remain solid. The wafer is then cooled 34 in ambient conditions. While the germanium liquid is cooling, a LPE growth mechanism is used to grow a second, single-crystal germanium layer 36, with the growth front beginning at the silicon/germanium interface in the seed windows, and propagating laterally. Single crystalline germanium is formed, wherein any defects are concentrated and terminated at the boundary of the seed window.

Figure 3:
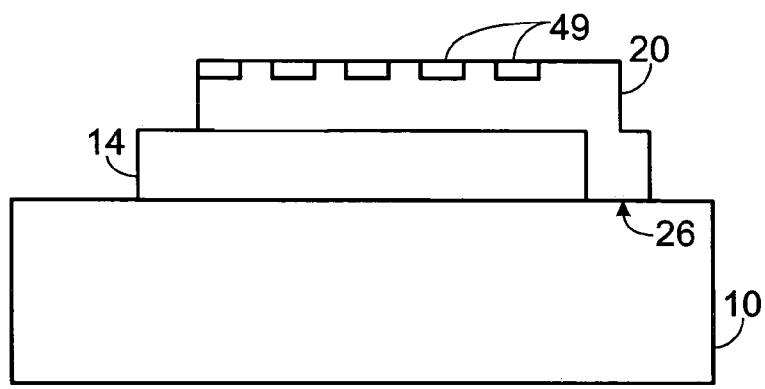
FIGS. 3 and 4 depict a germanium PIN diode using metal line for n+ and p+striping.
Figure 4:
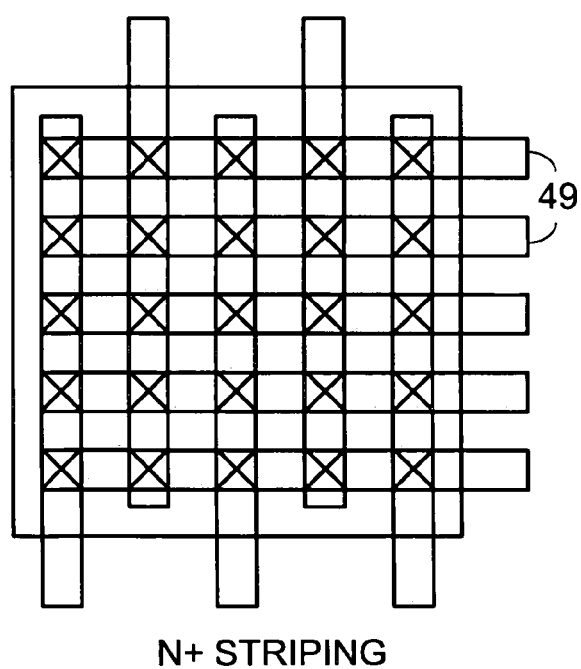
Figure 5:
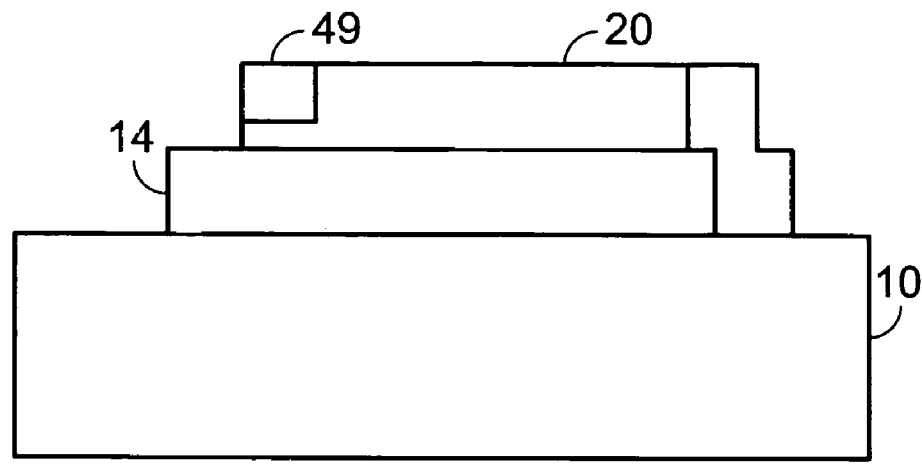
FIGS. 5 and 6 depict a germanium PIN diode using metal line for n+striping and silicon for p+striping.
Figure 6:
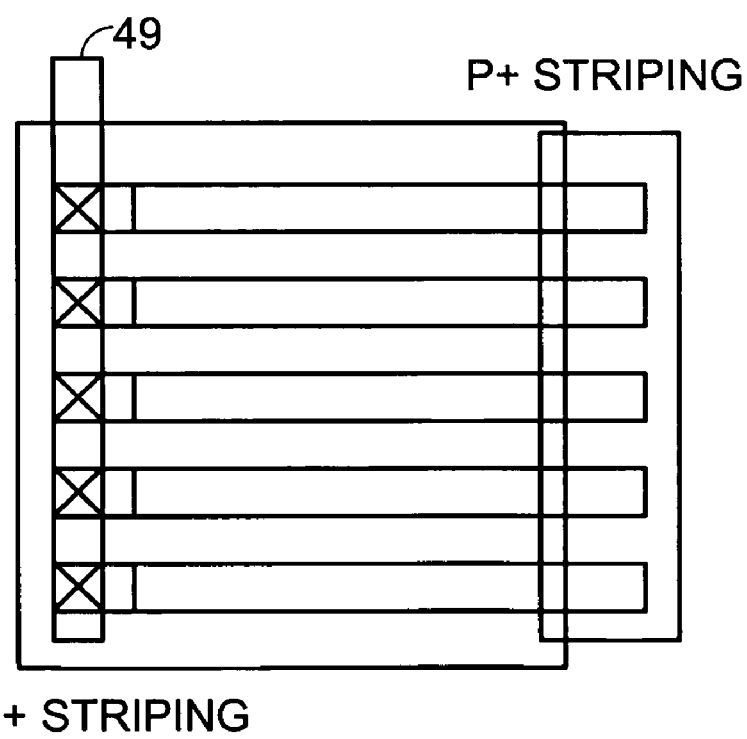

After germanium LPE process is completed, SiO₂ layer 28 is selectively removed 38 in a solution containing HF. Referring to FIGS. 3 to 6, n+ and p+ ion implantation 40 and dopant activation 42 are performed. Then, after contact formation 44 and metal striping 46, a PIN diode is completed 48. In FIGS. 3 and 4, the n+ and p+ striping both use metal lines 49, as shown in cross section and top plan view, respectively. In FIGS. 5 and 6, the n+ striping is by metal line while the p+ striping is by silicon substrate, or vice versa, as shown in cross section and top plan view, respectively. The germanium p-i-n photodetector is then completed. Other forms of germanium photodetectors may be fabricated according to the method of the invention, for example, a metal-germanium-metal (MSM-type) photodetector may be fabricated, as may germanium-based phototransistors, after completion of the forming of the single crystal germanium film.

The process steps described above are especially useful for the germanium photo imagers. Every pixel of the imager includes one germanium detector and several control silicon transistors. The peripheral circuits, such as the shift register and D/A converters, are fabricated on silicon and located on the periphery of the imager. Although the wiring density of the peripheral circuitry is high, it is low on the imager pixel area because the germanium photodetector is much larger than the control silicon transistors. Therefore, fabricating the germanium photodetector closer to the silicon transistor simplifies the integration process, and does not sacrifice the fill factor, i.e., detector area/pixel size, for the germanium detector.

Figure 7:
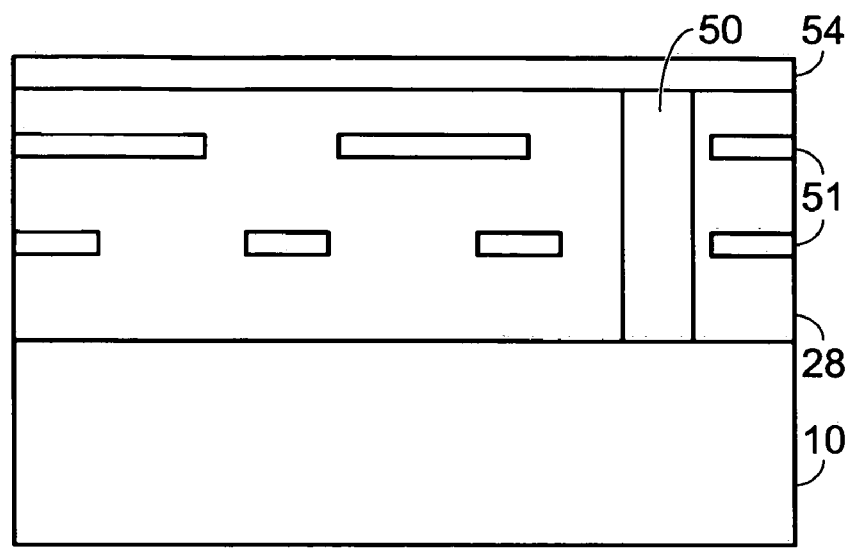
FIG. 7 depicts a silicon-filled via hole as the seed for germanium LPE.
Figure 8:
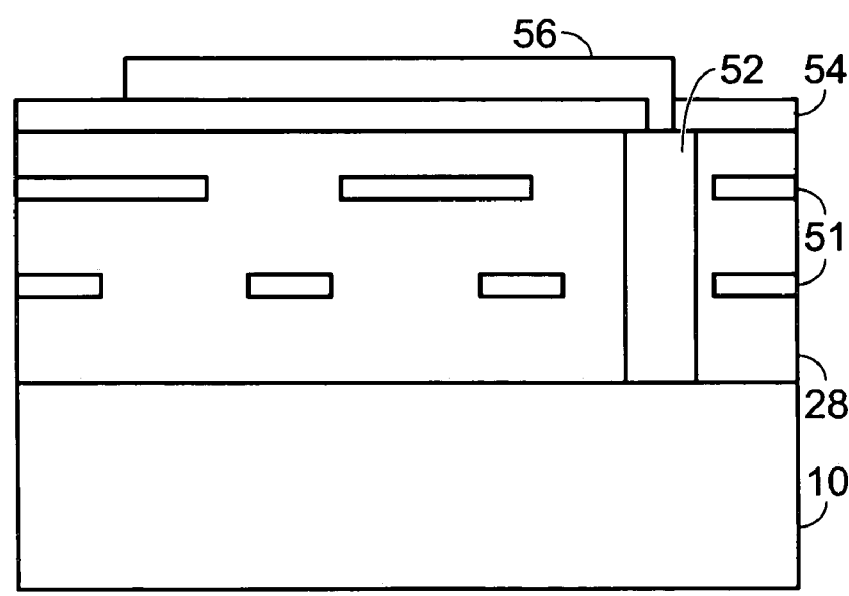
FIG. 8 depicts a germanium photodetector fabricated after a silicon CMOS process.

For some applications, the signal processor circuitry may be very complex, requiring many layers of metal wiring. To reduce the device size, locating the silicon circuitry under the germanium detector is preferable, so that the metal wiring will not block the signal before it reaches to the germanium detector. FIGS. 7 and 8 depict a modified method of the invention wherein several layers of metal connection, or connecting wires, 51, have been completed in the silicon CMOS process. Referring to FIG. 7, a via hole 50 is opened, extending to silicon surface 10. A selective deposition of silicon 52, or a blanket deposition and CMP of polysilicon, is provided to fill the via hole. A SiN layer 54 may be deposited as an alternate embodiment prior to the germanium LPE process. The silicon in the via hole acts a seed for the germanium LPE process. Referring to FIG. 8, after opening the SiN window, a germanium layer 56 is deposited, the structure is patterned, and a layer of SiO₂ is deposited. The germanium LPE process takes place in a RTA chamber, in steps similar to those previously described. A high melting temperature metal is needed for this application, such as tungsten, platinum or copper. After achieving the single crystal germanium layer, a germanium photodetector is fabricated as previously described. A metal-semiconductor-metal type photodetector may be preferred in this case, because of the low temperature processing possible with such a photodetector.

The type of metal used for the wiring depends on the photodetector fabrication process. For instance, if the fabrication of the germanium film occurs after formation of the wires, the wires must be capable of withstanding the RTA temperature of 920° C. to 1000° C., as when a germanium pin photodetector is being fabricated. Aluminum has a melting temperature of about 660° C., and is therefor not a suitable material for use in this process, thus use of tungsten, platinum or copper is required. If a MSM photodetector is being fabricated, n+ and p+ ion implantation and activation is not required, thus an RTA of at least 600° C. for several minutes is not required.

Thus, a method for fabricating a germanium photodetector through use of a germanium LPE process has been disclosed. It will be appreciated that further variations and modifications thereof may be made within the scope of the invention as defined in the appended claims.

We claim:

1. A method of fabricating a germanium photodetector comprising:
   preparing a silicon wafer as a silicon substrate;
   depositing a layer of silicon nitride on the silicon substrate;
   patterning and etching the silicon nitride layer;
   depositing a first germanium layer on the silicon nitride layer;
   patterning and etching the germanium layer wherein a portion of the germanium layer is in direct physical contact with the silicon substrate;
   depositing a layer of silicon oxide on the germanium layer wherein the germanium layer is encapsulated by the silicon oxide layer;
   annealing the structure at a temperature wherein the germanium layer melts and the other layers remain solid;
   cooling the structure in ambient conditions;
   growing a second, single-crystal layer of germanium on the structure by liquid phase epitaxy;
   selectively removing the silicon oxide layer;
   implanting and activating ions to form N+ and P+regions; and
   completing the germanium photodetector.

2. The method of claim 1 wherein said preparing a silicon wafer as a silicon substrate includes fabricating a silicon CMOS device on the silicon substrate.

3. The method of claim 2 which includes fabricating multiple layers of metal connecting wires on the substrate prior to germanium photodetector fabrication.

4. The method of claim 1 wherein said depositing a layer of silicon nitride on the silicon substrate includes depositing a layer of silicon nitride having a thickness of between about 10 nm to 500 nm.

5. The method of claim 1 wherein said depositing a first germanium layer on the silicon nitride layer includes depositing a first germanium layer to a thickness of between about 20 nm to 1000 nm.

6. The method of claim 5 wherein said depositing a first germanium layer includes depositing taken from the group of depositing methods consisting of CVD, PVD, MBE and other thin film deposition processes.

7. The method of claim 1 wherein said depositing a layer of silicon oxide on the germanium layer includes depositing a layer of silicon oxide to a thickness of between about 20 nm to 1000 nm.

8. The method of claim 1 wherein said annealing the structure includes annealing the structure at a temperature of between about 920° C. to 1000° C.

9. The method of claim 8 wherein said annealing includes annealing in a RTA chamber for a time period of between about zero time and ten minutes.

10. A method of fabricating a germanium photodetector comprising:
preparing a silicon wafer as a silicon substrate;
depositing a layer of silicon nitride on the silicon substrate;
patterning and etching the silicon nitride layer;
depositing a first germanium layer on the silicon nitride layer;
patterning and etching the germanium layer wherein a portion of the germanium layer is in direct physical contact with the silicon substrate;
depositing a layer of silicon oxide on the germanium layer wherein the germanium layer is encapsulated by the silicon oxide layer;
annealing the structure at a temperature of between about 920° C. to 1000° C. in a RTA chamber for a time period of between about zero time and ten minutes;
cooling the structure in ambient conditions;
growing a second, single-crystal layer of germanium on the structure by liquid phase epitaxy;
selectively removing the silicon oxide layer;
implanting and activating ions to form N+ and P+ regions; and
completing the germanium photodetector.

11. The method of claim 10 wherein said preparing a silicon wafer as a silicon substrate includes fabricating a silicon CMOS device on the silicon substrate.

12. The method of claim 11 which includes fabricating multiple layers of metal connecting wires on the substrate prior to germanium photodetector fabrication.

13. The method of claim 10 wherein said depositing a layer of silicon nitride on the silicon substrate includes depositing a layer of silicon nitride having a thickness of between about 10 nm to 500 nm.

14. The method of claim 10 wherein said depositing a first germanium layer on the silicon nitride layer includes depositing a first germanium layer to a thickness of between about 20 nm to 1000 nm by a deposition technique taken from the group of depositing techniques consisting of CVD, PVD, MBE and other thin film deposition processes.

15. The method of claim 10 wherein said depositing a layer of silicon oxide on the germanium layer includes depositing a layer of silicon oxide to a thickness of between about 20 nm to 1000 nm.

16. A method of fabricating a germanium photodetector comprising:
preparing a silicon wafer as a silicon substrate, including fabricating a CMOS device on the silicon substrate;
depositing a layer of silicon nitride on the silicon substrate;
patterning and etching the silicon nitride layer;
depositing a first germanium layer on the silicon nitride layer;
patterning and etching the germanium layer wherein a portion of the germanium layer is in direct physical contact with the silicon substrate;
depositing a layer of silicon oxide on the germanium layer wherein the germanium layer is encapsulated by the silicon oxide layer;
annealing the structure at a temperature of between about 920° C. to 1000° C. in a RTA chamber for a time period of between about zero time and ten minutes;
cooling the structure in ambient conditions;
growing a second, single-crystal layer of germanium on the structure by liquid phase epitaxy;
selectively removing the silicon oxide layer;
implanting and activating ions to form N+ and P+ regions; and
completing the germanium photodetector.

17. The method of claim 16 which includes fabricating multiple layers of metal connecting wires on the substrate prior to germanium photodetector fabrication.

18. The method of claim 16 wherein said depositing a layer of silicon nitride on the silicon substrate includes depositing a layer of silicon nitride having a thickness of between about 10 nm to 500 nm.

19. The method of claim 16 wherein said depositing a first germanium layer on the silicon nitride layer includes depositing a first germanium layer to a thickness of between about 20 nm to 1000 nm by a deposition technique taken from the group of depositing techniques consisting of CVD, PVD, MBE and other thin film deposition processes.

20. The method of claim 16 wherein said depositing a layer of silicon oxide on the germanium layer includes depositing a layer of silicon oxide to a thickness of between about 20 nm to 1000 nm.

* * * * *